United States Patent
Kim et al.

(10) Patent No.: US 7,016,257 B2
(45) Date of Patent: Mar. 21, 2006

(54) SEMICONDUCTOR MEMORY DEVICE CAPABLE OF GENERATING VARIABLE CLOCK SIGNALS ACCORDING TO MODES OF OPERATION

(75) Inventors: Nam-Seog Kim, Seoul (KR); Uk-Rae Cho, Suwon (KR); Yong-Jin Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 10/790,262

(22) Filed: Mar. 1, 2004

(65) Prior Publication Data

US 2004/0179421 A1 Sep. 16, 2004

(30) Foreign Application Priority Data

Mar. 13, 2003 (KR) ............... 10-2003-0015761

(51) Int. Cl.
*G11C 8/00* (2006.01)

(52) U.S. Cl. ............. 365/233; 365/201; 365/194
(58) Field of Classification Search .......... 365/233, 365/201, 194
See application file for complete search history.

(56) References Cited

U.S. PATENT DOCUMENTS 6,489,819 B1 * 12/2002 Kono et al. ............. 365/233
6,785,173 B1 * 8/2004 Sohn et al. ............. 365/201

FOREIGN PATENT DOCUMENTS

JP   11-297097   10/1999
JP   11-306797   11/1999

* cited by examiner

*Primary Examiner*—Huan Hoang
(74) *Attorney, Agent, or Firm*—F. Chau & Associates

(57) ABSTRACT

A semiconductor memory device comprising: an array of memory cells; an address input circuit for receiving an external address in response to an address clock signal; a selecting circuit for selecting a memory cell in response to an address output from the address input circuit; a data output circuit for outputting the data read out from the selected memory cell in response to first and second data clock signals; and an internal clock generating circuit for generating the address clock signal and the first and second data clock signals in response to an external clock signal and a complementary clock signal thereof, wherein the address clock signal and the first and second data clock signals have twice the frequency (or half the period) of the external clock signal when in a test mode.

19 Claims, 14 Drawing Sheets (Normal Mode)

(Test Mode)

SEMICONDUCTOR MEMORY DEVICE CAPABLE OF GENERATING VARIABLE CLOCK SIGNALS ACCORDING TO MODES OF OPERATION

BACKGROUND OF THE INVENTION

1. Technical Field

The present invention relates to a semiconductor integrated circuit device, and more particularly, to a synchronous semiconductor memory device.

2. Discussion of the Related Art

With the advance of complementary metal oxide semiconductor (CMOS) integrated circuit technology, an operating speed of an integrated circuit has been improved. In order to increase the operating speed of the integrated circuit, it is typically necessary to improve a clock signal used for driving the integrated circuit. This is accomplished by increasing a clock frequency of the clock signal. Among the problems that result due to increasing the clock signal's frequency, is a clock skew that occurs between an external clock signal and an internal clock signal. The resulting clock skew should be fixed because it can cause the integrated circuit to operate erroneously. Generally, a phase locked loop (PLL) circuit or a delay locked loop (DLL) circuit has been used to solve the clock skew. However, such circuits have a drawback in that a synchronization time is long. In order to solve this drawback, a synchronous mirror delay (SMD) circuit has been proposed. Existing SMD circuits generate an internal clock signal that is synchronized with an external clock signal in only two cycles.

Typical SMD circuits are disclosed in U.S. Pat. No. 6,060,920, entitled "MULTIPLEX SYNCHRONOUS DELAY CIRCUIT", and U.S. Pat. No. 6,373,913, entitled "INTERNAL CLOCK SIGNAL GENERATOR INCLUDING CIRCUIT FOR ACCURATELY SYNCHRONIZING INTERNAL CLOCK SIGNAL WITH EXTERNAL CLOCK SIGNAL".

While operating speeds semiconductor memory devices continue to be increased, an operating speed of test equipment for testing semiconductor memory devices has been lagging when compared to that of the semiconductor memory devices. As the operating speed of the semiconductor memory devices increases, a frequency range in which the semiconductor memory device operates is different than that of the existing test equipment. As shown in FIG. 1, although an operating frequency range of the test equipment is within a predefined synchronization range of a clock generating circuit, such as a SMD, PLL and DLL, contained in the semiconductor memory device, it is difficult to test the high-speed memory device in its operating environment because the operating frequency range of the test equipment is low.

Accordingly, there is a need for a device that allows for the testing of a semiconductor memory device in its operating environment at a high frequency range using test equipment having a lower frequency range.

SUMMARY OF THE INVENTION

In accordance with one aspect of the present invention, a semiconductor memory device comprises: an array of memory cells; an address input circuit for receiving an external address in response to an address clock signal; a selecting circuit for selecting a memory cell in response to an address output from the address input circuit; a data output circuit for outputting data read out from the selected memory cell in response to first and second data clock signals; and an internal clock generating circuit for generating the address clock signal and the first and second data clock signals in response to an external clock signal and complementary clock signal, wherein the address clock signal and the first and second data clock signals have twice the frequency of the external clock signal in a test mode.

In accordance with another aspect of the present invention, the internal clock generating circuit generates the address clock signal and the first and second data clock signals having the same frequency or period as the external clock signal in a normal mode. In accordance with yet another aspect of the present invention, the semiconductor memory device further comprises: a data input circuit for receiving external data in response to the first and second data clock signals; a write driver circuit for writing data of the data input circuit to the selected memory cells of the array; and a read out circuit for reading out data from the selected memory cell and sending it to the data output circuit. The internal clock generating circuit comprises a synchronous mirror delay circuit and the semiconductor memory device is a double data rate (DDR) memory device.

In the test mode, the internal clock generating circuit generates the address clock signal at every ¼ period of the external clock signal, the first data clock signal at every 0 and ½ periods of the external clock signal, and the second data clock signal at every ¼ and ¾ periods of the external clock signal. When in a normal mode, the internal clock generating circuit generates the address clock signal at every 0 period of the external clock signal, the first data clock signal at every 0 period of the external clock signal, and the second data clock signal at every ½ period of the external clock signal.

In accordance with yet another aspect of the present invention, a semiconductor memory device comprises: an array of memory cells; an address input circuit for receiving an external address in response to an address clock signal; a selecting circuit for selecting a memory cell in response to an address output from the address input circuit; a data output circuit for outputting data read out from the selected memory cell in response to first and second data clock signals; a first clock generating circuit comprising a first synchronous mirror delay circuit, for generating a first internal clock signal and a second internal clock signal having 0T and T/4 phases of an external clock signal, respectively, where T is a period of the external clock signal; and a second clock generating circuit comprising a second synchronous mirror delay circuit, for generating a third internal clock signal and a fourth internal clock signal having T/2 and 3T/4 phases of the external clock signal, respectively, wherein, in a test mode, the address clock signal is generated in synchronization with the first, second, third and fourth clock signals, the first data clock signal is generated in synchronization with the first, second and third internal clock signals, and the second data clock signal is generated in synchronization with the second and fourth internal clock signals.

In accordance with another aspect of the present invention, a semiconductor memory device, comprises: a memory cell array for storing data, wherein the memory cell array comprises a plurality of memory cells; an address input circuit for receiving external address signals in synchronization with an address clock signal output from an internal clock generating circuit; a decoder for decoding addresses output from the address input circuit and selecting a memory cell that is associated with the addresses output from the address input circuit of the memory cell array; a data input circuit for receiving a first and second data clock signal from an internal clock generating circuit; a data output circuit for outputting data from the selected memory cells; and an internal clock generating circuit for receiving external clock signals and generating the address clock signal and the first and second data clock signals, wherein the address clock signal and first and second data clock signals have twice the frequency of the external clock signals according to a mode of operation.

BRIEF DESCRIPTION OF THE DRAWINGS

The features of the present invention will become more apparent by describing in detail exemplary embodiments thereof with reference to the attached drawings, in which.

DETAILED DESCRIPTION OF EXEMPLARY EMBODIMENTS

Figure 1:
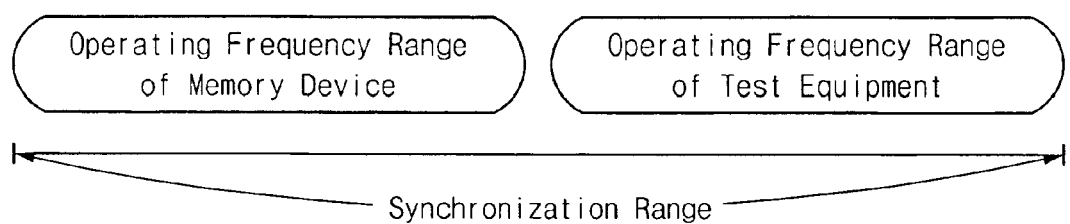
FIG. 1 illustrates operating frequency regions of a high-speed memory device and associated test equipment.
Figure 2:
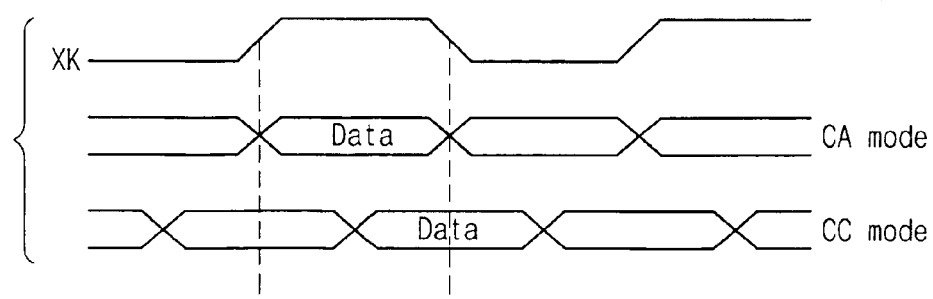
FIG. 2 illustrates a clock centered (CC) mode and clock aligned (CA) mode of a semiconductor memory device according to an exemplary embodiment of the present invention.

A semiconductor memory device according to an exemplary embodiment of the present invention is a double data rate (DDR) memory device that performs data input/output operations in synchronization with high edges and low edges of a clock signal. It is to be understood, however, that the present invention is not limited to the DDR memory device. The memory device according to the present invention selectively operates in a clock centered (CC) mode and a clock aligned (CA) mode, depending on whether data is output in synchronization with a phase of a clock signal. As shown in FIG. 2, output data "Data" is aligned within a half frequency of an external clock signal XK in a CC mode and aligned with the high/low edges of the external clock signal XK in the CA mode. Hereinafter, "T" represents one period of the external clock signal XK.

Figure 3:
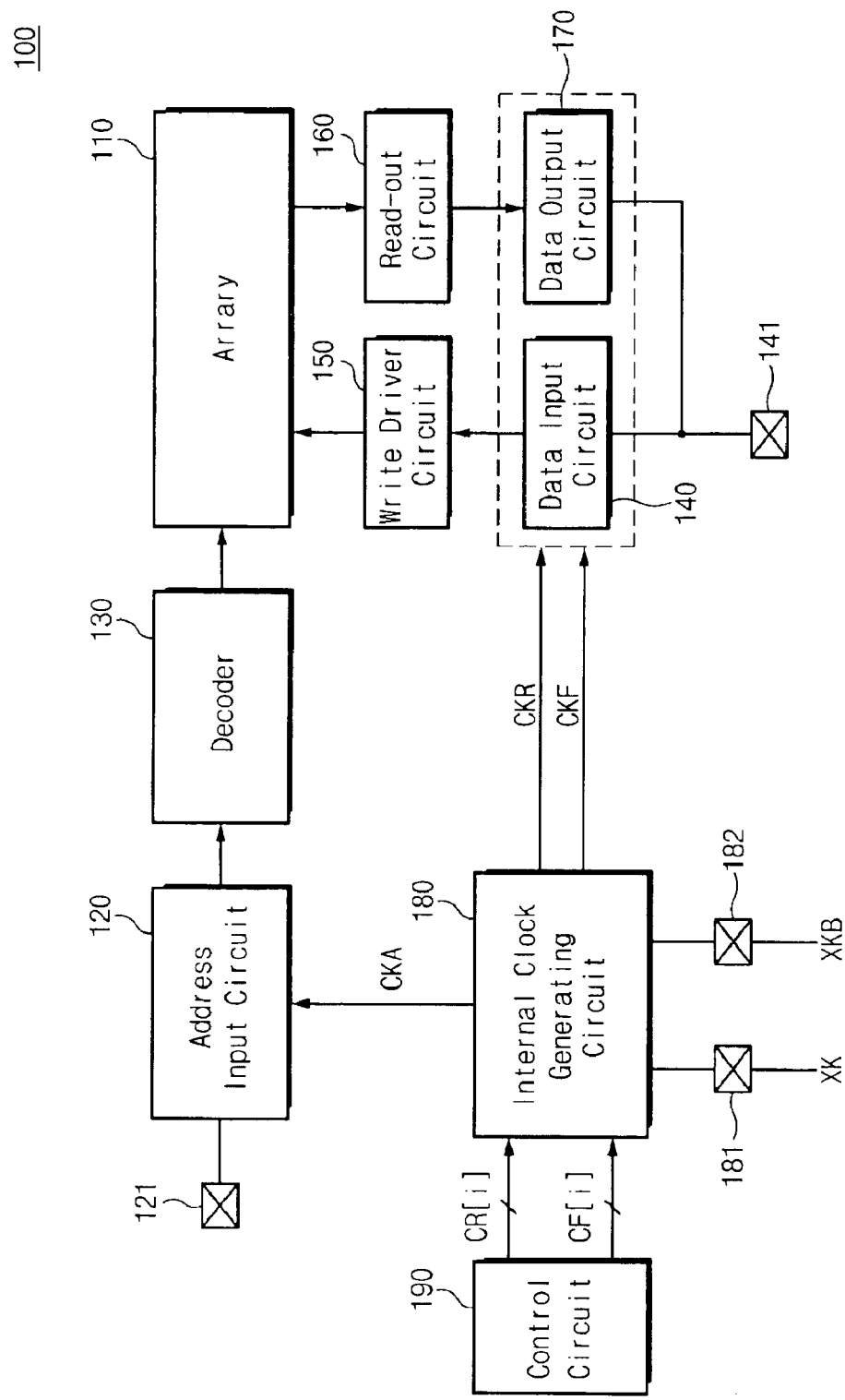
FIG. 3 is a schematic block diagram of a semiconductor memory device according to an exemplary embodiment of the present invention.

FIG. 3 is a schematic block diagram of a semiconductor memory device 100 according to an exemplary embodiment of the present invention. Referring to FIG. 3, the semiconductor memory device 100 includes a memory cell array 110 for storing data. Although not shown in FIG. 3, the memory cell array 110 includes a plurality of memory cells arranged in a matrix of rows and columns. An address input circuit 120 is connected to an address pad 121 and receives external addresses in synchronization with an address clock signal CKA output from an internal clock generating circuit 180. Although one address pad is shown in the drawing, it is to be understood that more than one address pad can be used with the present invention. A decoder 130 decodes addresses output from the address input circuit 120 and memory cells of the memory cell array 110 are selected according to the decoding.

A data input circuit 140 is connected to an address pad 141 and receives external data in response to data clock signals CKR and CKF output from the internal clock generating circuit 180. Although one address pad is shown in the drawing, it is to be understood that more than one address pad can be used with the present invention. A write driver circuit 150 writes the data, which is transferred from the data input circuit 140, to the memory cell array 110. A read-out circuit 160 reads out data from the memory cell array 110, and a data output circuit 170 receives the read-out data from the read-out circuit 160 in response to the data clock signals CKR and CKF output from the internal clock generating circuit 180.

The internal clock generating circuit 180 is connected to pads 181 and 182 and receives an external clock signal XK and a complementary clock signal XKB via the pads 181 and 182. The internal clock generating circuit 180 is provided with synchronous mirror delay circuits, which will be described hereinafter with reference to FIGS. 4A and 4B. The internal clock generating circuit 180 is controlled by a control circuit 190 and generates the address clock signal CKA and the data clock signals CKR and CKF. The address and data clock signals CKA, CKR and CKF have different clock periods (or frequencies) according to modes of operation. For example, the address clock signal CKA has the same clock frequency (or period) as the external clock signal XK in a normal mode and has twice the clock frequency (or half the clock period) of the external clock signal XK in a test mode. The data clock signal CKR has the same clock frequency (or period) as the external clock signal XK in the normal mode and has twice the clock frequency (or half the clock period) of the external clock signal XK in the test mode. The data clock signal CKF has the same clock frequency (or period) as the external clock signal XK in the normal mode and has twice the clock frequency (or half the clock period) of the external clock signal XK in the test mode.

According to the semiconductor memory device 100, of the present invention, although the operating frequency range of test equipment is lower than the frequency range of the semiconductor memory device 100, it is possible to test the semiconductor memory device 100 at a high frequency range (e.g., in its typical operating environment) by generating the internal clock signals CKA, CKR and CKF having twice the clock frequency (or half the clock period) of the external clock signal XK supplied from the test equipment.

Figure 4A:
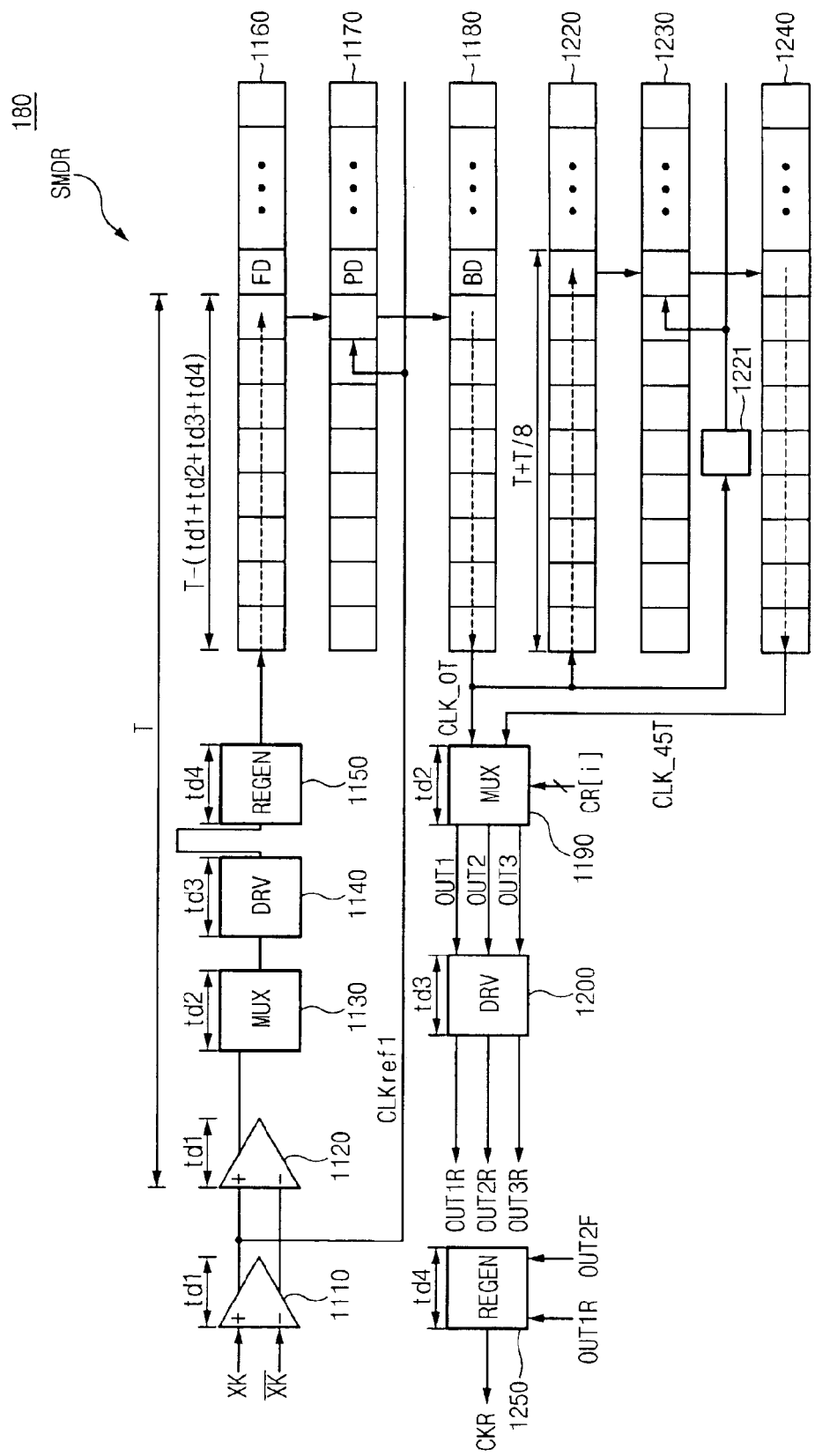
FIG. 4A is a circuit diagram of the internal clock generating circuit of FIG. 3 according to an exemplary embodiment of the present invention.
Figure 4B:
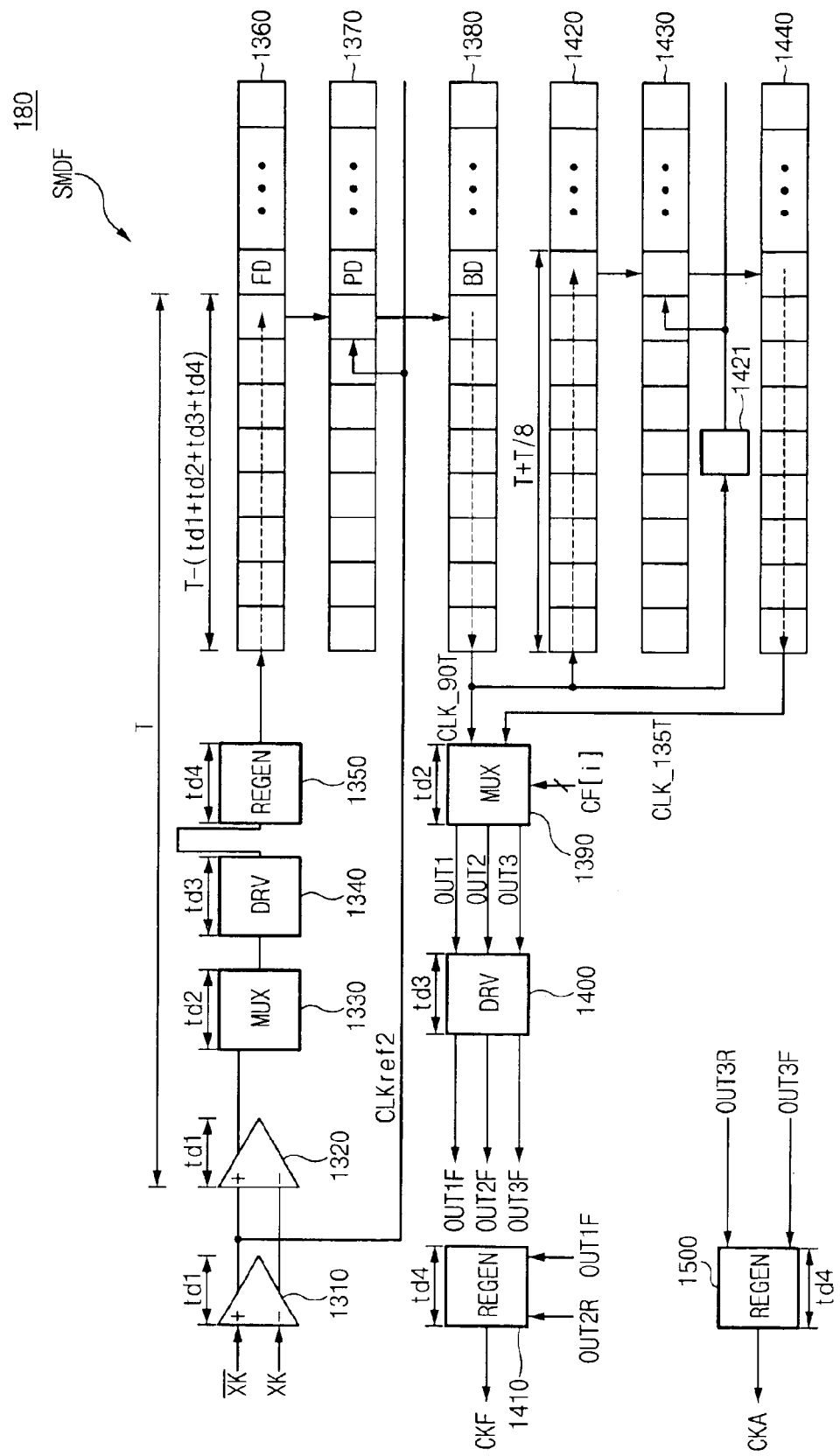
FIG. 4B is a circuit diagram of the internal clock generating circuit of FIG. 3 according to an exemplary embodiment of the present invention.

FIGS. 4A and 4B are block diagrams of the internal clock generating circuit 180 of FIG. 3 according to an exemplary embodiment of the present invention. Referring to FIGS. 4A and 4B, the internal clock generating circuit 180 includes first and second synchronous mirror delay circuits SMDR and SMDF and first, second and third clock generators 1250, 1410 and 1500. The first synchronous mirror delay circuit SMDR receives the external clock signal XK and the complementary clock signal XKB "$\overline{XK}$" and generates clock signals CLK_0T and CLK_45T that are internally synchronized with the external clock signal XK. The clock signal CLK_0T is a clock signal synchronized at a 0T phase of the external clock signal XK, and the clock signal CLK_45T is a clock signal synchronized at a T/4 phase of the external clock signal XK. The clock signals CLK_0T and CLK_45T will be described in detail below with reference to FIG. 4A.

The first synchronous mirror delay circuit SMDR includes first and second clock buffer circuits 1110 and 1120, first and second multiplexers (MUXs) 1130 and 1190, first and second driving circuits (DRV) 1140 and 1200, a regenerating circuit (REGEN) 1150, first and second forward delay arrays (FDAs) 1160 and 1220, first and second mirror control circuits (MCCs) 1170 and 1230, and first and second backward delay arrays (BDAs) 1180 and 1240. As shown in FIG. 4A, the clock buffer circuit 1120, the multiplexer 1130, the driving circuit 1140 and the regenerating circuit 1150 form a delay monitor circuit (DMC).

The first clock buffer circuit 1110 receives the external clock signal XK and generates a reference clock signal CLKref1 of a one-shot pulse shape. The reference clock signal CLKref1 is delayed by a delay time of "td1" through the first clock buffer circuit 1110. The delay monitor circuit formed by the second clock buffer circuit 1120, the first multiplexer 1130, the first driving circuit 1140 and the regenerating circuit 1150 delays the reference clock signal CLKref1 by a delay time of "td1+td2+td3+td4". The first forward delay array 1160 includes a plurality of serially-connected delay units (FDs), each of which has the same delay time. Each serially-connected delay unit delays an input clock signal and outputs the delayed clock signal.

Referring again to FIG. 4A, the first mirror control circuit 1170 includes a plurality of phase detectors (PDs) that correspond to respective delay units of the first forward delay array 1160. Each phase detector of the first mirror control circuit 1170 receives the reference clock signal CLKref1 from the first clock buffer circuit 1110 and the delayed clock signal from the corresponding delay unit of the first forward delay array 1160. Each phase detector detects whether or not the inputted clock signals have the same phase. The first backward delay array 1180 includes a plurality of serially-connected delay units (BDs) that correspond to respective phase detectors of the first mirror control circuit 1170. Each delay unit (BD) is configured to have the same delay time as the delay unit of the first forward delay array 1160.

The second forward delay array 1220 includes a plurality of serially-connected forward delay units (FDs), each of which delays an input signal by a delay time of "T/8" to output the delay clock signal. A delay unit 1221 delays the clock signal CLK_0T, which is output from the first backward delay array 1180, by a delay time of "T/8". The second mirror control circuit 1230 includes a plurality of phase detectors (PDs) that correspond to respective delay units of the second forward delay array 1220. Each phase detector receives the clock signal from the delay unit 1221 and the delay clock signal from the corresponding delay unit of the second forward delay array 1220. Each phase detector detects whether or not the inputted clock signals have the same phase. The second backward delay array 1240 includes a plurality of serially-connected delay units (BDs) that correspond to respective phase detectors of the second mirror control circuit 1230. Each delay unit (BD) is configured to have the same delay time (i.e., T/8) as the delay unit of the second forward delay array 1220.

The second multiplexer 1190 receives the clock signals CLK_0T and CLK_45T from the first and second backward delay arrays 1180 and 1240 and outputs signals OUT1, OUT2 and OUT3 having different phases in response to a control code CR[i] output from the control circuit 190. The signals OUT1, OUT2 and OUT3 outputted from the second multiplexer 1190 are clock signals that are delayed by a time delay of "td2" with respect to the inputted clock signals CLK_0T and CLK_45T. For example, in the CC mode, the outputted signals OUT1 and OUT3 are clock signals that are synchronized at a 0T phase of the external clock signal XK, and the output signal OUT2 has a high level. The output signal OUT1 is a clock signal that is synchronized at a T/4 phase of the external clock signal in the CA mode, the output signal OUT3 is a clock signal that is synchronized at a 0T phase of the external clock signal XK in the CA mode, and the output signal OUT2 has a high level. In the test mode, the output signals OUT1 and OUT3 are clock signals that are synchronized at a 0T phase of the external clock signal XK and the output signal OUT2 is a clock signal that is synchronized at a T/4 phase of the external clock signal XK. The second driving circuit 1200 delays the output signals OUT1, OUT2 and OUT3 of the second multiplexer 1190 by a delay time of "td3".

As shown in FIG. 4B, the second synchronous mirror delay circuit SMDF receives the external clock signal XK and the complementary clock signal XKB "$\overline{XK}$" and generates clock signals CLK_90T and CLK_135T that are internally synchronized with the external clock signal XK. The clock signal CLK_90T is a clock signal that is synchronized at a T/2 phase of the external clock signal XK, and the clock signal CLK_135T is a clock signal that is synchronized at a 3T/4 phase of the external clock signal XK. The clock signals CLK_90T and CLK_135T will be described in detail below with reference to FIG. 4B.

The second synchronous mirror delay circuit SMDF includes third and fourth clock buffer circuits 1310 and 1320, third and fourth multiplexers (MUXs) 1330 and 1390, third and fourth driving circuits (DRV) 1340 and 1400, a regenerating circuit (REGEN) 1350, third and fourth forward delay arrays 1360 and 1420, third and fourth mirror control circuits 1370 and 1430, and third and fourth backward delay arrays (BDAs) 1380 and 1440. As shown in FIG. 4B, the clock buffer circuit 1320, the multiplexer 1330, the driving circuit 1340 and the regenerating circuit 1350 form a delay monitor circuit.

The third clock buffer circuit 1310 receives the external clock signal XKB "$\overline{XK}$" and generates a reference clock signal CLKref2 of a one-shot pulse shape. The reference clock signal CLKref2 is delayed by a delay time of "td1" through the third clock buffer circuit 1310. The delay monitor circuit formed by the fourth clock buffer circuit 1320, the third multiplexer 1330, the third driving circuit 1340 and the regenerating circuit 1350 delays the reference clock signal CLKref2 by a delay time of "td1+td2+td3+td4". The third forward delay array 1360 includes a plurality of serially-connected delay units (FDs), each of which has the same delay time. Each serially-connected delay unit delays an input clock signal and outputs the delayed clock signal.

Referring again to FIG. 4B, the third mirror control circuit 1370 includes a plurality of phase detectors (PDs) that correspond to respective delay units of the third forward delay array 1360. Each phase detector of the third mirror control circuit 1370 receives the reference clock signal CLKref2 from the third clock buffer circuit 1310 and the delayed clock signal from the corresponding delay unit of the third forward delay array 1360. Each phase detector detects whether or not the inputted clock signals have the same phase. The third backward delay array 1380 includes a plurality of serially-connected delay units (BDs) that correspond to respective phase detectors of the third mirror control circuit 1370. Each delay unit (BD) is configured to have the same delay time as the delay unit of the third forward delay array 1360.

The fourth forward delay array 1420 includes a plurality of serially-connected forward delay units (FDs), each of which delays an input signal by a delay time of "T/8" to output the delay clock signal. A delay unit 1421 delays the clock signal CLK_90T, which is output from the third backward delay array 1380, by a delay time of "T/8". The fourth mirror control circuit 1430 includes a plurality of phase detectors (PDs) that correspond to respective delay units of the fourth forward delay array 1420. Each phase detector receives the clock signal from the delay unit 1421 and the delay clock signal from the corresponding delay unit of the fourth forward delay array 1420. Each phase detector detects whether or not the inputted clock signals have the same phase. The fourth backward delay array 1440 includes a plurality of serially-connected delay units (BDs) that correspond to respective phase detectors of the fourth mirror control circuit 1430. Each delay unit (BD) is configured to have the same delay time as the delay unit of the fourth forward delay array 1420.

The fourth multiplexer 1390 receives the clock signals CLK_90T and CLK_135T from the third and fourth backward delay arrays 1380 and 1440 and outputs signals OUT1, OUT2 and OUT3 having different phases in response to a control code CF[i] output from the control circuit 190. The signals OUT1, OUT2 and OUT3 outputted from the fourth multiplexer 1390 are signals that are delayed by a delay time of "td2" with respect to the inputted clock signals CLK_90T and CLK_135T. For example, in the CC mode, the output signal OUT1 is a clock signal that is synchronized at a T/2 phase of the external clock signal XK, and the output signals OUT2 and OUT3 have a high level. In the CA mode, the output signal OUT1 is a clock signal that is synchronized at a 3T/4 phase of the external clock signal, and the output signals OUT2 and OUT3 have a high level. In the test mode, the output signal OUT1 is a clock signal that is synchronized at a 3T/4 phase of the external clock signal XK and the output signals OUT2 and OUT3 are clock signals that are synchronized at a T/2 phase of the external clock signal XK. The fourth driving circuit 1400 delays the output signals OUT1, OUT2 and OUT3 of the fourth multiplexer 1390 by a delay time of "td3".

The first clock generator 1250 generates the data clock signal CKR in response to an output signal OUT1R of the second driving circuit 1200 and an output signal OUT2F of the fourth driving circuit 1400. The data clock signal CKR is a signal that is delayed by a delay time "td4" with respect to the inputted signals OUT1R and OUT2F. The second clock generator 1410 generates the data clock signal CKF in response to an output signal OUT2R of the second driving circuit 1200 and an output signal OUT1F of the fourth driving circuit 1400. The data clock signal CKF is a signal that is delayed by a delay time "td4" with respect to the inputted signals OUT2R and OUT1F. The third clock generator 1500 generates the address clock signal CKA in response to an output signal OUT3R of the second driving circuit 1200 and an output signal OUT3F of the fourth driving circuit 1400. The address clock signal CKA is a signal that is delayed by a delay time "td4" with respect to the inputted signals OUT3R and OUT3F.

Equation 1 represents a time necessary for the data and address clock signals CKR and CKA to be synchronized at the 0T phase of the external clock signal XK.

$$T\_CKR(0T)=2(td1+td2+td3+td4)+2\{T-(td1+td2+td3+td4)\}=2T \quad \text{[Equation 1]}$$

Equation 2 represents a time necessary for the data clock signal CKR to be synchronized at a T/4 phase of the external clock signal XK.

$$T\_CKR(T/4)=2(td1+td2+td3+td4)+2\{T-(td1+td2+td3+td4)\}+2(T+T/8)=4T+T/4 \quad \text{[Equation 2]}$$

A time necessary for the data clock signal CKF to be synchronized at a 90T phase of the external clock signal XK is equal to Equation 1, and a time necessary for the data clock signal CKF to be synchronized at a 135T phase of the external clock signal XK is equal to Equation 2.

Figure 5:
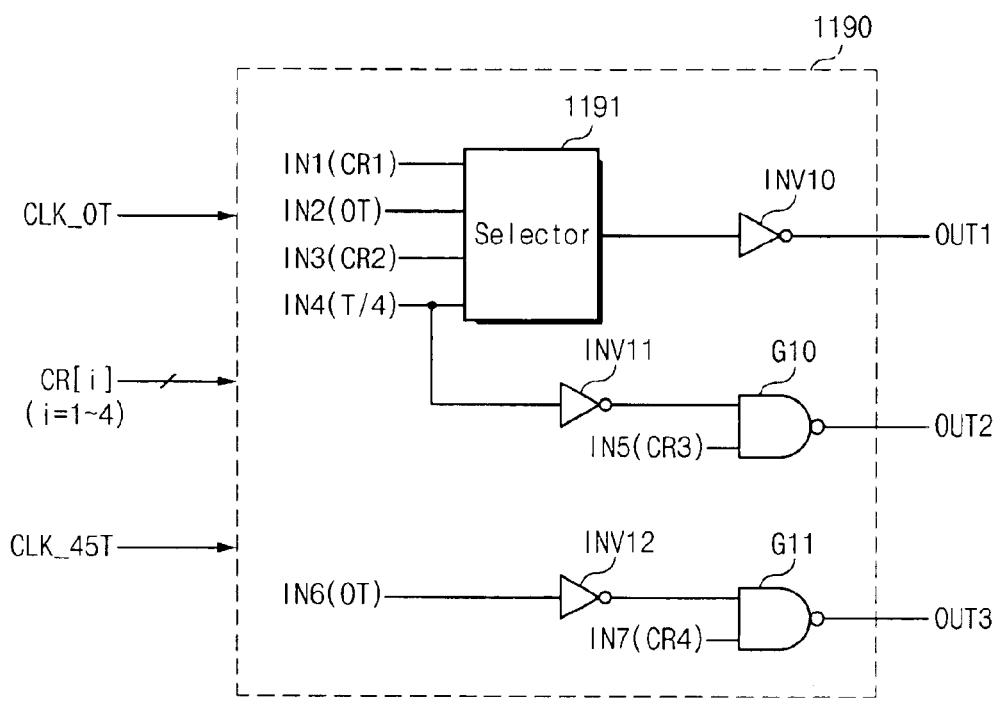
FIG. 5 is a circuit diagram of the second multiplexer of FIG. 4 according to an exemplary embodiment of the present invention.
Figure 6:
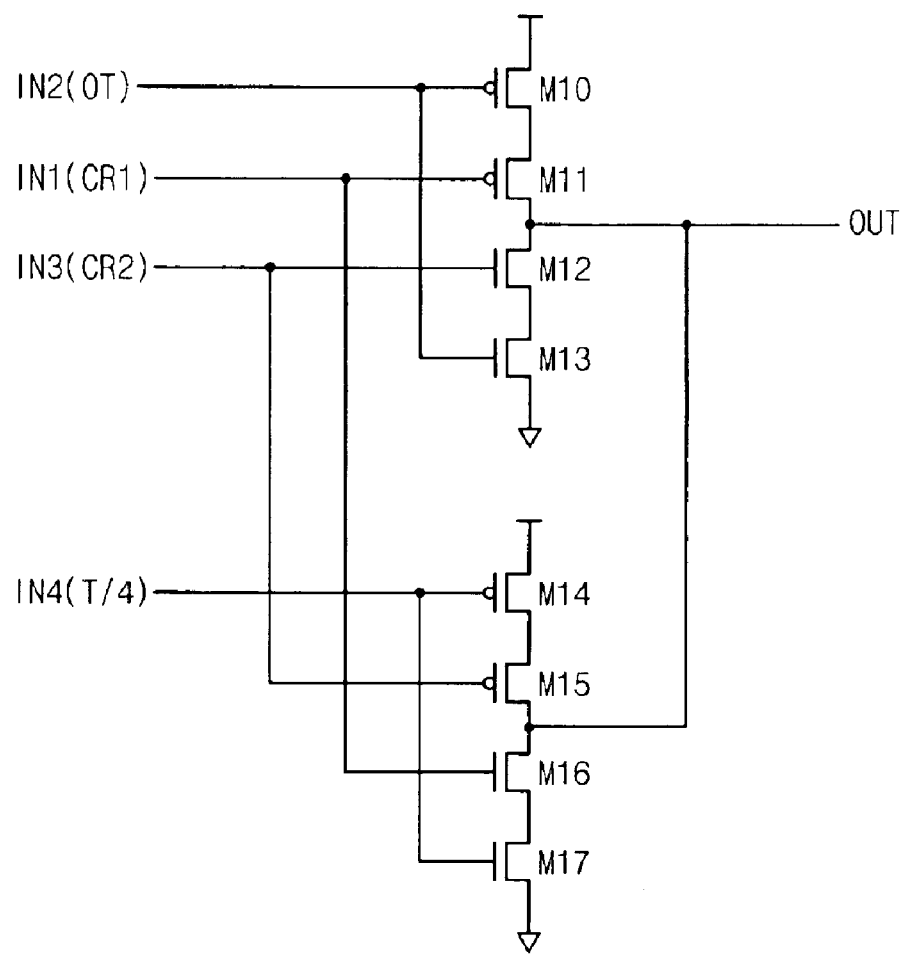
FIG. 6 is a circuit diagram of the selector of FIG. 5 according to an exemplary embodiment of the present invention.

FIG. 5 is a circuit diagram of the second multiplexer 1190 of FIG. 4 according to an exemplary embodiment of the present invention, and FIG. 6 is a circuit diagram of the selector 1191 of FIG. 5 according to an exemplary embodiment of the present invention.

Referring to FIG. 5, the second multiplexer 1190 receives the clock signals CLK_0T and CLK_45T from the first and second backward delay arrays 1180 and 1240 and outputs the signals OUT1, OUT2 and OUT3 having different phases in response to the control code CR[i] (i=1, 2, 3, 4). The second multiplexer 1190 includes the selector 1191, inverters INV10, INV11 and INV12, and NAND gates G10 and G11. The selector 1191 receives the clock signals CLK_0T and CLK_45T as input signals IN2(0T) and IN4(T/4) and then selects one of the input signals in response to control signals IN1(CR1) and IN3(CR2). As shown in FIG. 6, the selector 1191 includes positive channel metal oxide semiconductor (PMOS) transistors M10, M11, M14 and M15 and negative channel metal oxide semiconductor (NMOS) transistors M12, M13, M16 and M17. The clock signal selected by the selector 1191 is output as the signal OUT1 through the inverter INV10. The NAND gate G10 receives a control signal IN5(CR3) and the clock signal IN4(T/4), which is transferred through the inverter INV11, and outputs the signal OUT2. The NAND gate G11 receives a control signal IN7(CR4) and the clock signal IN6(0T), which is transferred through the inverter INV12, and outputs the signal OUT3.

According to the present invention, the control code CR[i] has different values according to the modes of operation. For example, a control code CR4CR3CR2CR1 has a value of "1010" in the CC mode, a value of "1001" in the CA mode and a value of "1110" in the test mode. The generation of the output signals OUT1, OUT2 and OUT3 according to the modes of operation will be described in detail below with reference to FIGS. 5 and 6.

Since the control signals CR1 and CR2 are respectively set to a low level and a high level in the CC mode and the test mode, the MOS transistors M11 and M12 are turned on and the MOS transistors M15 and M16 are turned off. In this condition, when the clock signal IN2(0T) is transferred as the output signal OUT1 through the inverter INV10, the clock signal IN4(T/4) is blocked. In other words, the output signal OUT1 is a clock signal having the same phase as the clock signal CLK__0T in the CC mode and the test mode. Since the control signals CR1 and CR2 are respectively set to a high level and a low level in the CA mode, the MOS transistors M11 and M12 of the selector 1191 are turned off and the MOS transistors M15 and M16 are turned on. In this condition, when the clock signal IN4(T/4) is transferred as the output signal OUT1 through the inverter INV10, the clock signal IN1(0T) is blocked. In other words, the output signal OUT1 is a clock signal having the same phase as the clock signal CLK__45T in the CA mode.

Since the control signal CR3 is set to a low level in the CC mode and the CA mode, the NAND gate G10 outputs the output signal OUT2 of a high level without regard to other inputs. Additionally, since the control signal CR3 is set to a high level in the test mode, the NAND gate G10 outputs the input signal IN4(T/4), which is transferred through the inverter INV11, as the output signal OUT2. In other words, the output signal OUT2 is a signal equal to the clock signal CLK__45T. Since the control signal CR4 is set to a high level in the CC and CA modes and the test mode, the NAND gate G11 outputs the input signal IN6(0T), which is transferred through the inverter INV12, as the output signal OUT3. In other words, the output signal OUT3 is a signal equal to the clock signal CLK__0T.

Figure 7A:
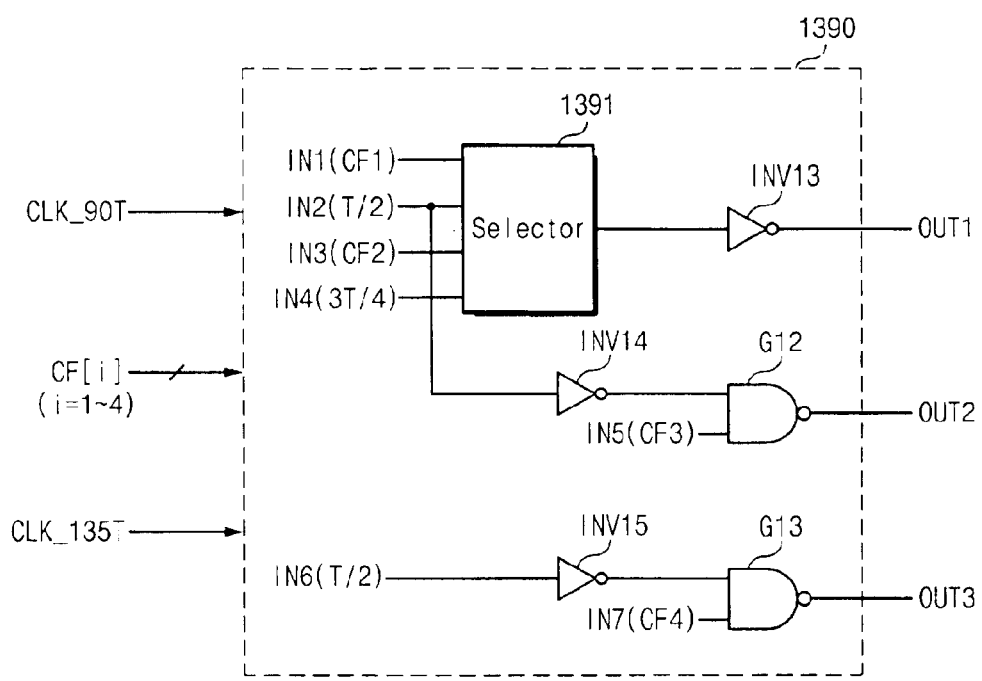
FIG. 7A is a circuit diagram of the fourth multiplexer of FIG. 4 according to an exemplary embodiment of the present invention.
Figure 7B:
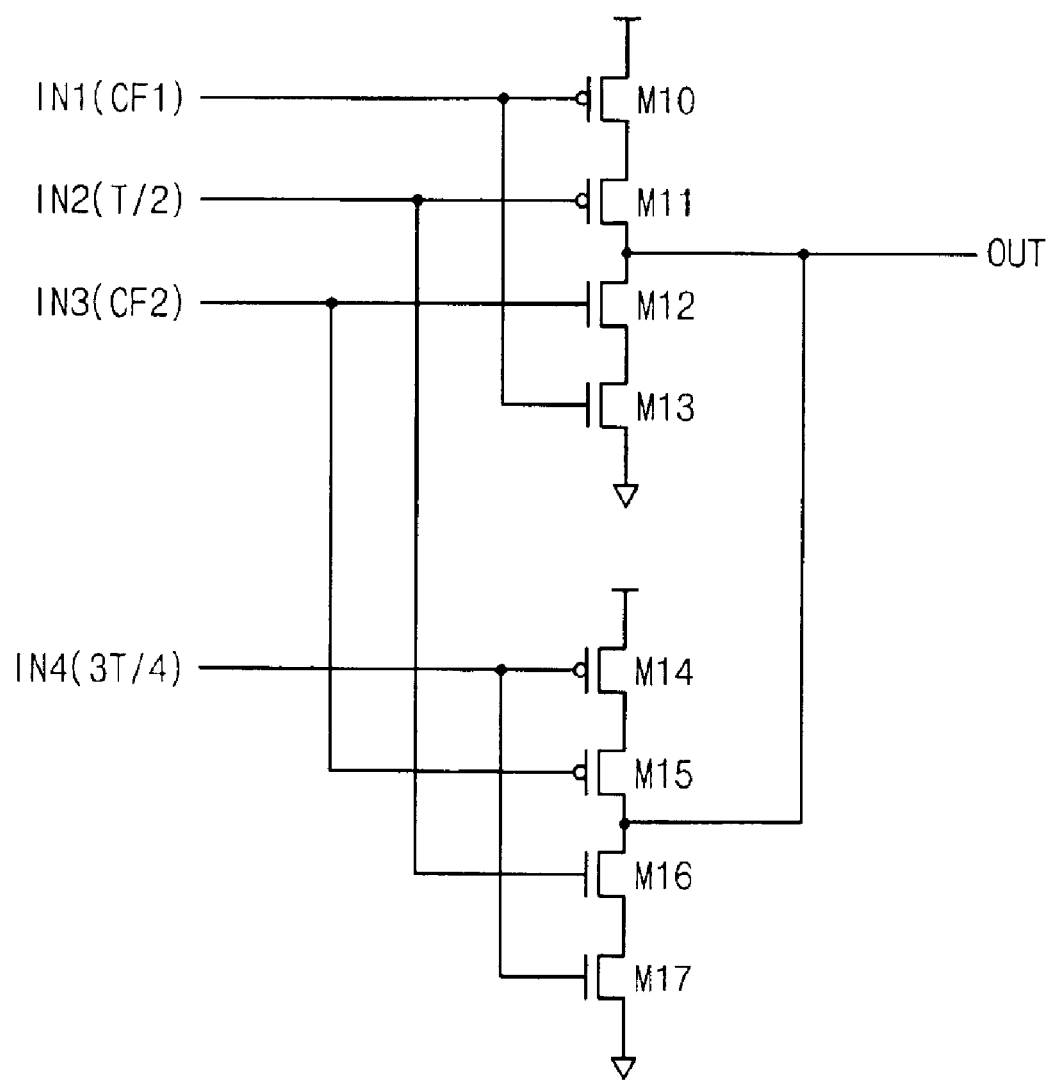
FIG. 7B is a circuit diagram of the selector of FIG. 7A according to an exemplary embodiment of the present invention.

FIG. 7A is a circuit diagram of the fourth multiplexer 1390 of FIG. 4 according to an exemplary embodiment of the present invention. Referring to FIG. 7A, the fourth multiplexer 1390 receives the clock signals CLK__90T and CLK__135T and outputs the signals OUT1, OUT2 and OUT3 having different phases in response to the control code CF[i] (i=1, 2, 3, 4). The fourth multiplexer 1390 includes a selector 1391, inverters INV13, INV14 and INV15, and NAND gates G12 and G13. The selector 1391 receives the clock signals CLK__90T and CLK__135T as input signals IN2(T/2) and IN4(3T/4) and then selects one of the input signals in response to control signals IN1(CF1) and IN3(CF2). As shown in FIG. 7B, the selector 1391 has the same or similar structure as the selector 1191 that of FIG. 6. The clock signal selected by the selector 1391 is output as the signal OUT1 through the inverter INV13. The NAND gate G12 receives a control signal IN5(CF3) and the clock signal IN2(T/2), which is transferred through the inverter INV14, and outputs the signal OUT2. The NAND gate G13 receives a control signal IN7(CF4) and the clock signal IN6(T/2), which is transferred through the inverter INV15, and outputs the signal OUT3.

According to the present invention, the control code CF[i] has different values according to the modes of operation. For example, the control code CF4CF3CF2CF1 has a value of "0010" in the CC mode, a value of "0001" in the CA mode and a value of "1101 " in the test mode. The generation of the output signals OUT1, OUT2 and OUT3 according to the modes of operation will be described in detail below with reference to FIGS. 7A and 7B.

Since the control signals CF1 and CF2 are respectively set to a low level and a high level in the CC mode, the MOS transistors M11 and M12 of the selector 1391 are turned on and the MOS transistors M15 and M16 are turned off. In this condition, when the clock signal IN2(T/2) is transferred as the output signal OUT1 through the inverter INV13, the clock signal IN4(3T/4) is blocked. In other words, the output signal OUT1 is a clock signal having the same phase as the clock signal CLK__90T in the CC mode. Since the control signals CF1 and CF2 are respectively set to a high level and a low level in the CA mode and the test mode, the MOS transistors M11 and M12 of the selector 1391 are turned off and the MOS transistors M15 and M16 are turned on. In this condition, when the clock signal IN4(3T/4) is transferred as the output signal OUT1 through the inverter INV13, the clock signal IN2(T/2) is blocked. In other words, the output signal OUT1 is a clock signal having the same phase as the clock signal CLK__135T in the CA mode and the test mode.

Since the control signal CF3 is set to a low level in the CC mode and the CA mode, the NAND gate G12 outputs the output signal OUT2 of a high level without regard to other inputs. Additionally, since the control signal CF3 is set to a high level in the test mode, the NAND gate G12 outputs the input signal IN2(T/2), which is transferred through the inverter INV14, as the output signal OUT2. In other words, the output signal OUT2 is a signal equal to the clock signal CLK__90T. Since the control signal CF4 is set to a low level in the CC mode and the CA mode, the NAND gate G13 outputs the output signal OUT3 of a high level without regard to other inputs. Since the control signal CF4 is set to a high level in the test mode, the NAND gate G13 outputs the input signal IN6(T/2), which is transferred through the inverter INV15, as the output signal OUT3. In other words, the output signal OUT3 is a clock signal having the same phase as the clock signal CLK__90T.

Table 1 shows the values of the input and output signals of the second and fourth multiplexers 1190 and 1390 in the CC mode.

TABLE 1

|  | IN1 | IN2 | IN3 | IN4 | IN5 | IN6 | IN7 | OUT1 | OUT2 | OUT3 |
| --- | --- | --- | --- | --- | --- | --- | --- | --- | --- | --- |
| SMDR | L | 0T | H | T/4 | L | 0T | H | 0T | H | 0T |
| SMDF | L | T/2 | H | 3T/4 | L | T/2 | L | T/2 | H | H |

Table 2 shows the values of the input and output signals of the second and fourth multiplexers 1190 and 1390 in the CA mode.

TABLE 2

|      | IN1 | IN2 | IN3 | IN4 | IN5 | IN6 | IN7 | OUT1 | OUT2 | OUT3 |
|------|-----|-----|-----|-----|-----|-----|-----|------|------|------|
| SMDR | H   | 0T  | L   | T/4 | L   | 0T  | H   | T/4  | H    | 0T   |
| SMDF | H   | T/2 | L   | 3T/4| L   | T/2 | L   | 3T/4 | H    | H    |

Table 3 shows the values of the input and output signals of the second and fourth multiplexers 1190 and 1390 in the test mode.

TABLE 3

|      | IN1 | IN2 | IN3 | IN4 | IN5 | IN6 | IN7 | OUT1 | OUT2 | OUT3 |
|------|-----|-----|-----|-----|-----|-----|-----|------|------|------|
| SMDR | L   | 0T  | H   | T/4 | H   | 0T  | H   | 0T   | T/4  | 0T   |
| SMDF | H   | T/2 | L   | 3T/4| H   | T/2 | H   | 3T/4 | T/2  | T/2  |

Figure 8:
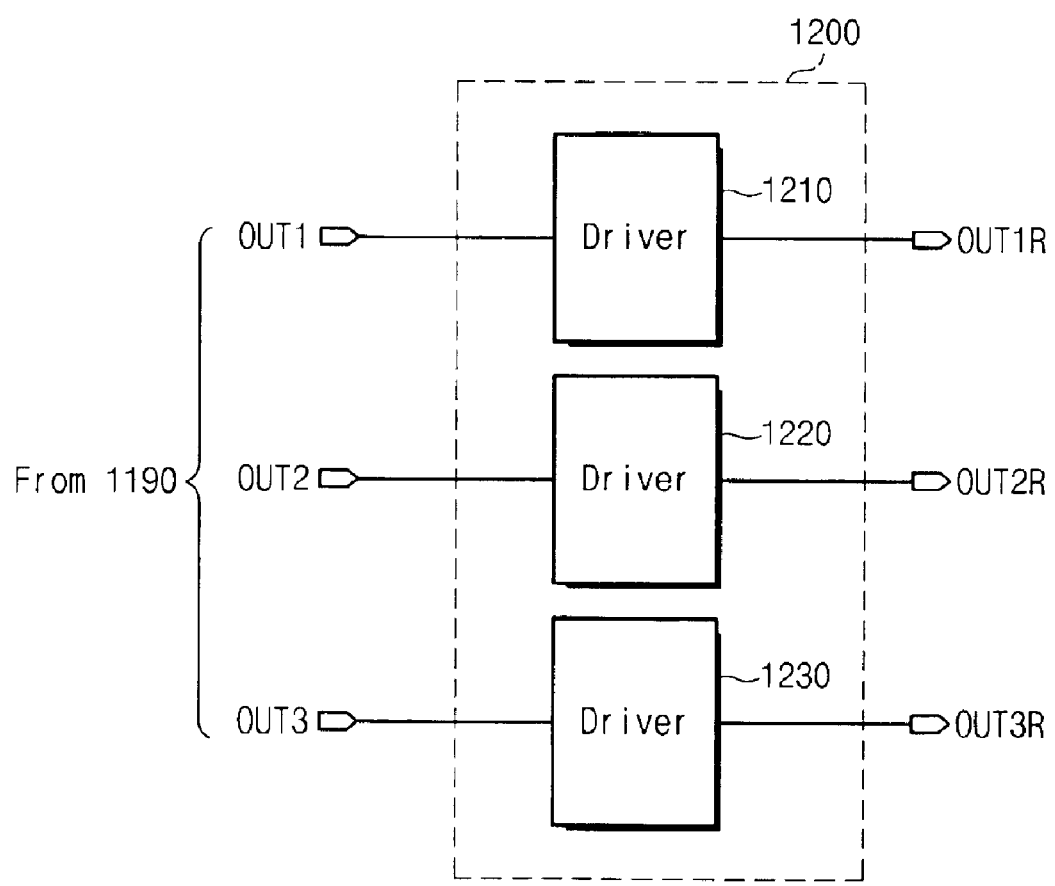
FIG. 8 is a block diagram of the second driving circuit of FIG. 4A according to an exemplary embodiment of the present invention.
Figure 9:
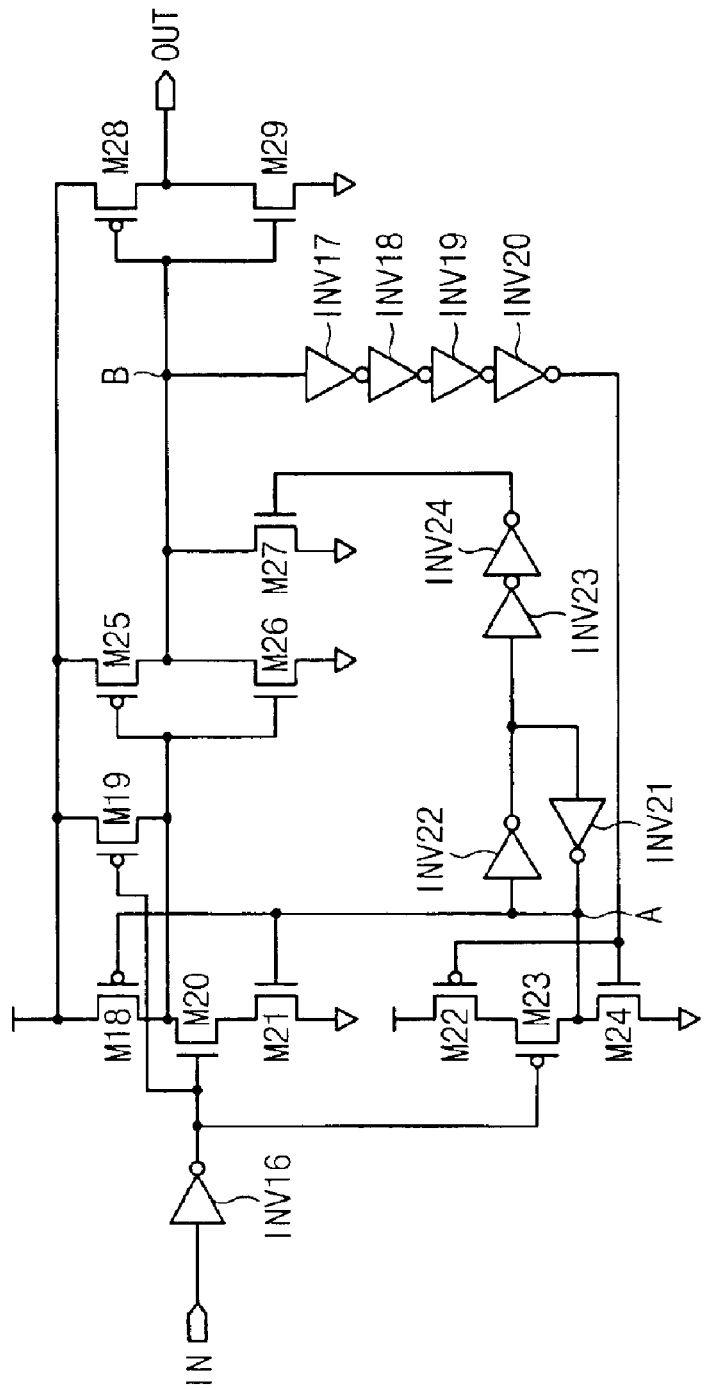
FIG. 9 is a circuit diagram illustrating one of the drivers of FIG. 8 according to an exemplary embodiment of the present invention.

FIG. 8 is a block diagram of the second driving circuit 1200 of FIG. 4A according to an exemplary embodiment of the present invention, and FIG. 9 is a circuit diagram of one of the drivers 1210, 1220 and 1230 of FIG. 8 according to an exemplary embodiment of the present invention.

Referring to FIG. 8, the second driving circuit 1200 includes three drivers 1210, 1220 and 1230. The drivers 1210, 1220 and 1230 respectively receive the output signals OUT1, OUT2 and OUT3 of the multiplexer 1190, and delay the inputted signals by the delay time of "td3". As shown in FIG. 9, each of the drivers 1210, 1220 and 1230 include PMOS transistors M18, M19, M22, M23, M25 and M28, NMOS transistors M20, M21, M24, M26, M27 and M29, and INV16–INV24. The driver of FIG. 9 is a self reset CMOS circuit and an operation of the driver will be described below.

When an input signal IN is at a high level, the MOS transistors M19, M22, M23, M26 and M28 are turned on so that an output signal OUT goes to a high level. When the input signal IN changes from a high level to a low level, the MOS transistors M20, M25 and M29 are turned on and the MOS transistors M19, M26 and M28 are turned off. When an internal node B changes from a low level to a high level, the MOS transistor M18 is turned on and the MOS transistor M21 is turned off after a delay time of a signal path that extends between the inverters INV17–INV20 and the MOS transistor M24. Accordingly, the output signal OUT changes from a low level to a high level. As the internal node B changes from the high level to the low level, the driver is automatically initialized for an input of another signal. In other words, the MOS transistors M21 and M22 are turned on and the MOS transistors M18 and M24 are turned off.

Figure 10:
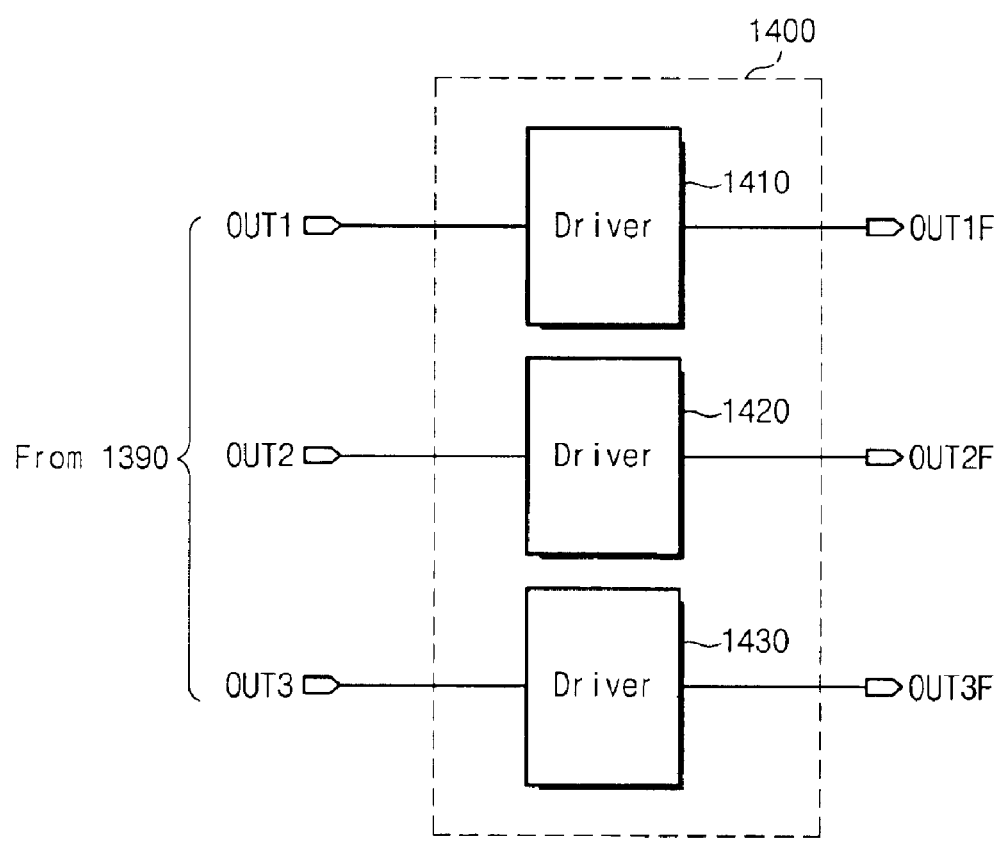
FIG. 10 is a block diagram of the fourth driving circuit of FIG. 4B according to an exemplary embodiment of the present invention.

FIG. 10 is a block diagram of the fourth driving circuit 1400 of FIG. 4B according to an exemplary embodiment of the present invention. Referring to FIG. 10, the fourth driving circuit 1400 includes three drivers 1410, 1420 and 1430. The drivers 1410, 1420 and 1430 respectively receive the output signals OUT1, OUT2 and OUT3 of the fourth multiplexer 1390, and delay the inputted signals by the delay time of "td3". The drivers 1410, 1420 and 1430 have the same or similar structure as the drivers 1210, 1220 and 1230 of FIG. 9.

Figure 11:
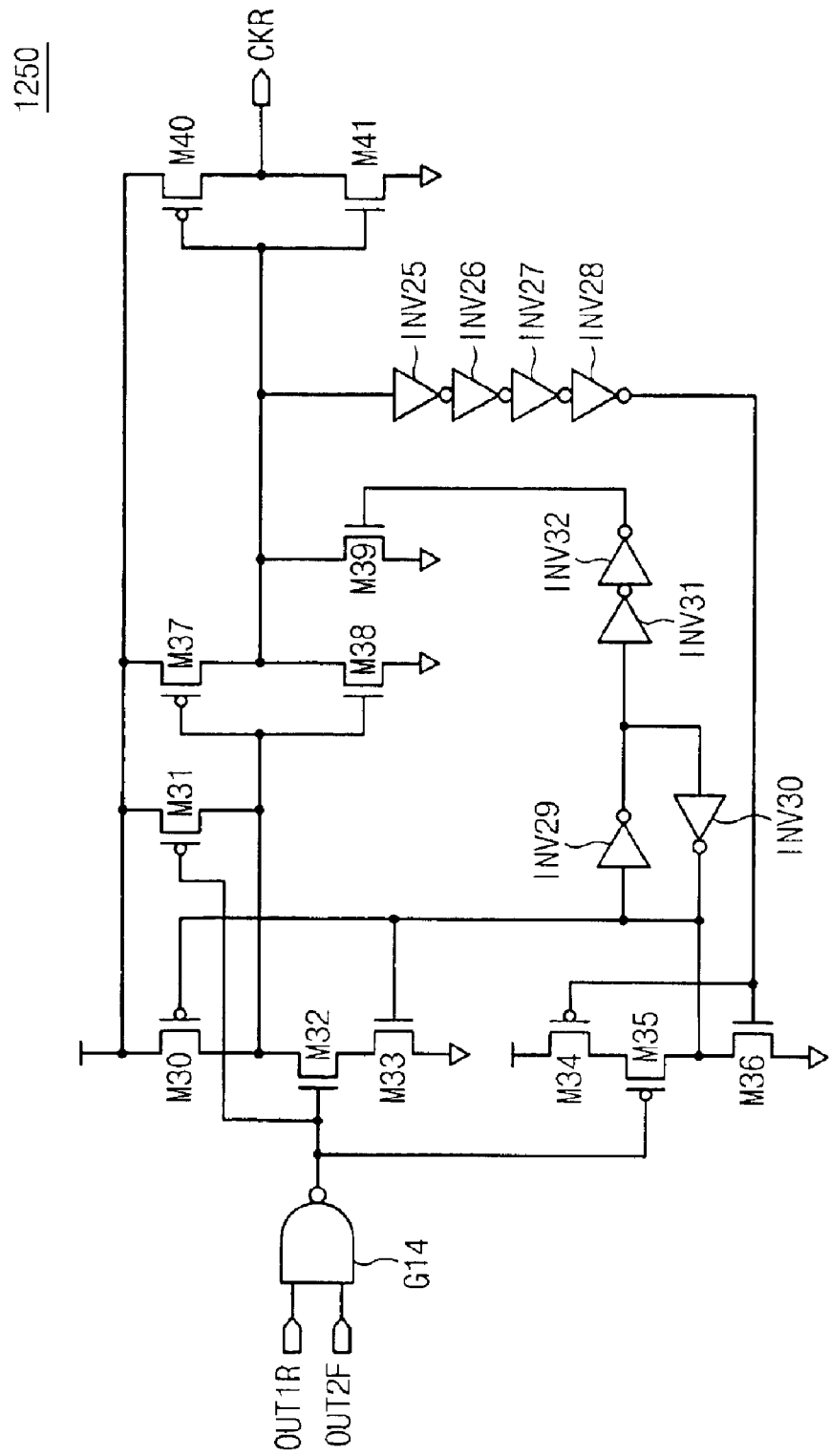
FIG. 11 is a circuit diagram of the clock generator of FIG. 4A according to an exemplary embodiment of the present invention.

FIG. 11 is a circuit diagram of the first clock generator 1250 of FIG. 4A according to an exemplary embodiment of the present invention. Referring to FIG. 11, the first clock generator 1250 includes PMOS transistors M30, M31, M34, M35, M37 and M40, NMOS transistors M32, M33, M36, M38, M39 and M41, inverters INV25–INV32 and a NAND gate G14. The input signal OUT1R is a clock signal output from the second driving circuit 1200 and the input signal OUT2F is a clock signal output from the fourth driving circuit 1400 (of FIG. 4B). The first clock generator 1250 operates as a pulse generator and its operation is similar to the drivers 1210, 1220 and 1230 of FIG. 9. It is to be understood that the second and third clock generators 1410 and 1500 (of FIG. 4B) have the same or similar structure as the first clock generator 1250.

Table 4 shows the input and output signals OUT1R, OUT2F and CKR of the first clock generator 1250 according to the modes of operation.

TABLE 4

|       | CC MODE | CA MODE | TEST MODE  |
|-------|---------|---------|------------|
| OUT1R | 0T      | T/4     | 0T         |
| OUT2F | H       | H       | T/2        |
| CKR   | 0T      | T/4     | 0T or T/2  |

In the CA and CC modes, in which the input signal OUT2F is maintained at a high level, the first clock generator 1250 outputs the clock signal OUT1R as the data clock signal CKR, which is synchronized at the 0T phase of the external clock signal XK. In the test mode, the first clock generator 1250 alternately outputs the clock signals OUT1R and OUT2F as the data clock signal CKR, which are respectively synchronized at the 0T and T/2 phases of the external clock signal XK.

Table 5 shows the input and output signals OUT2R, OUT1F and CKF of the second clock generator 1410 according to the modes of operation.

TABLE 5

|       | CC MODE | CA MODE | TEST MODE    |
|-------|---------|---------|--------------|
| OUT2R | T/2     | 3T/4    | T/4          |
| OUT1F | H       | H       | 3T/4         |
| CKF   | T/2     | 3T/4    | T/4 or 3T/4  |

In the CC mode, in which the input signal OUT1F is maintained at a high level, the second clock generator 1410 outputs the clock signal OUT2R as the data clock signal CKF, which is synchronized at the T/2 phase of the external clock signal XK. In the CA mode, in which the input signal OUT1F is maintained at a high level, the second clock generator 1410 outputs the clock signal OUT2R as the data clock signal CKF, which is synchronized at the 3T/4 phase of the external clock signal XK. In the test mode, the second clock generator 1410 alternately outputs the clock signals OUT2R and OUT1F as the data clock signal CKR, which are respectively synchronized at the T/4 and 3T/4 phases of the external clock signal XK.

Table 6 shows the input and output signals OUT3R, OUT3F and CKF of the third clock generator 1500 according to the modes of operation.

TABLE 6

|  | CC MODE | CA MODE | TEST MODE |
| --- | --- | --- | --- |
| OUT3R | 0T | 0T | 0T |
| OUT3F | H | H | T/2 |
| CKF | 0T | 0T | 0T or T/2 |

In the CC and CA modes, in which the input signal OUT3F is maintained at a high level, the third clock generator 1500 outputs the clock signal OUT3R as the data clock signal CKF, which is synchronized at the 0T phase of the external clock signal XK. In the test mode, the third clock generator 1500 alternately outputs the clock signals OUT3R and OUT3F as the data clock signal CKR, which are respectively synchronized at the 0T and T/2 phases of the external clock signal XK.

Figure 12:
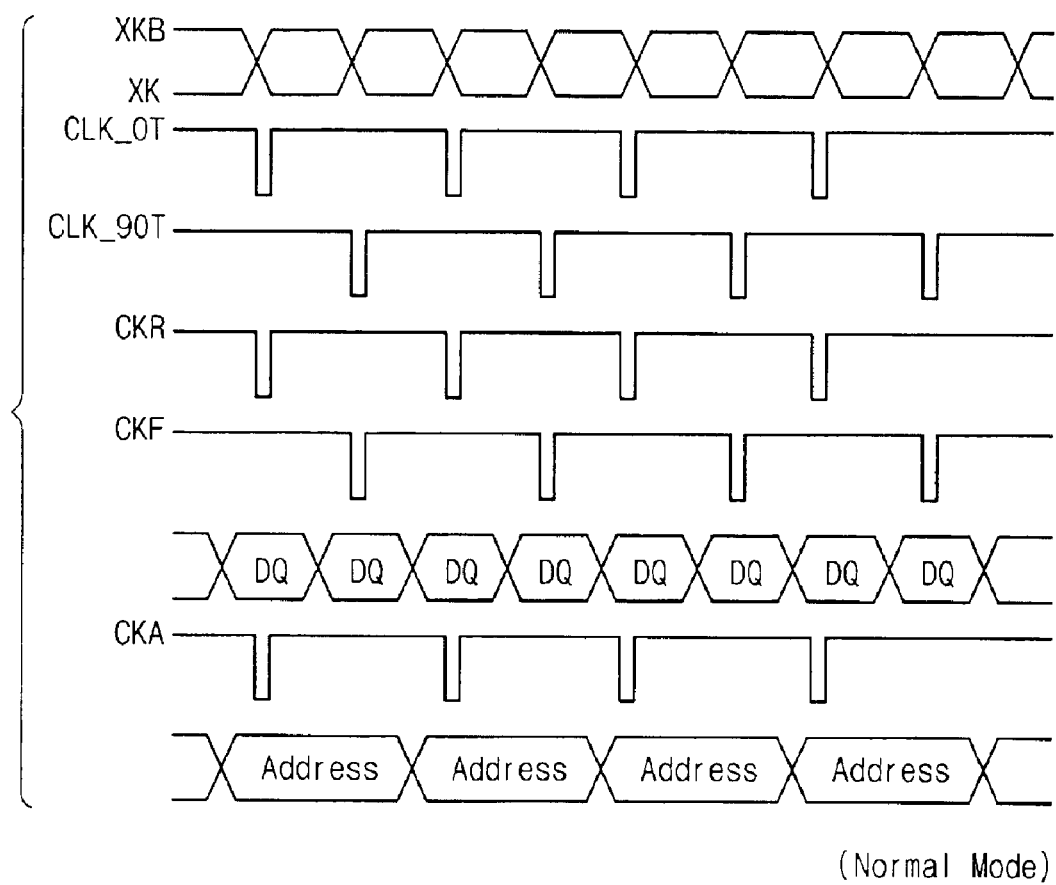
FIG. 12 is a timing chart illustrating the data clock signals CKR and CKF and the address clock signal CKA generated in the CC mode of the semiconductor memory device according to an exemplary embodiment of the present invention.

FIG. 12 is a timing chart of the data clock signals CKR and CKF and the address clock signal CKA generated in the CC mode of the semiconductor memory device 100 according to an exemplary embodiment of the present invention.

In order to perform the read operation in the CC mode, the control circuit 190 generates the control code C[i] of "0010". The second multiplexer 1190 of the SMDR circuit (of FIG. 4A) outputs the output signals OUT1, OUT2 and OUT3, which respectively have a 0T phase, a high level and a 0T phase, in response to the control code C[i]. The fourth multiplexer 1390 of the SMDF circuit (of FIG. 4B) outputs the output signals OUT1, OUT2 and OUT3, which respectively have a T/2 phase, a high level and a high level, in response to the control code C[i]. Accordingly, the third clock generator 1500 generates the address clock signal CKA synchronized at a 0T phase of the external clock signal XK. The address input circuit 120 receives the addresses in synchronization with the address clock signal CKA. In other words, in the read operation of the CC mode, the addresses are input once in synchronization with the low-high transition of the external clock signal XK.

At the same time, the first clock generator 1250 generates the data clock signal CKR synchronized at a 0T phase of the external clock signal XK, and the second clock generator 1410 generates the data clock signal CKF synchronized at a T/2 phase of the external clock signal XK. The data output circuit 170 outputs the read-out data once in synchronization with the data clock signal CKR and once in synchronization with the data clock signal CKF. In other words, in the read operation of the CC mode, the data is output twice in synchronization with the low-high transition and the high-low transition of the external clock signal XK.

If the phase difference between the clock signals generated in the CA mode and the CC mode is 90T, the read operation of the CA mode is performed in the same or similar manner as that of the CC mode.

Figure 13:
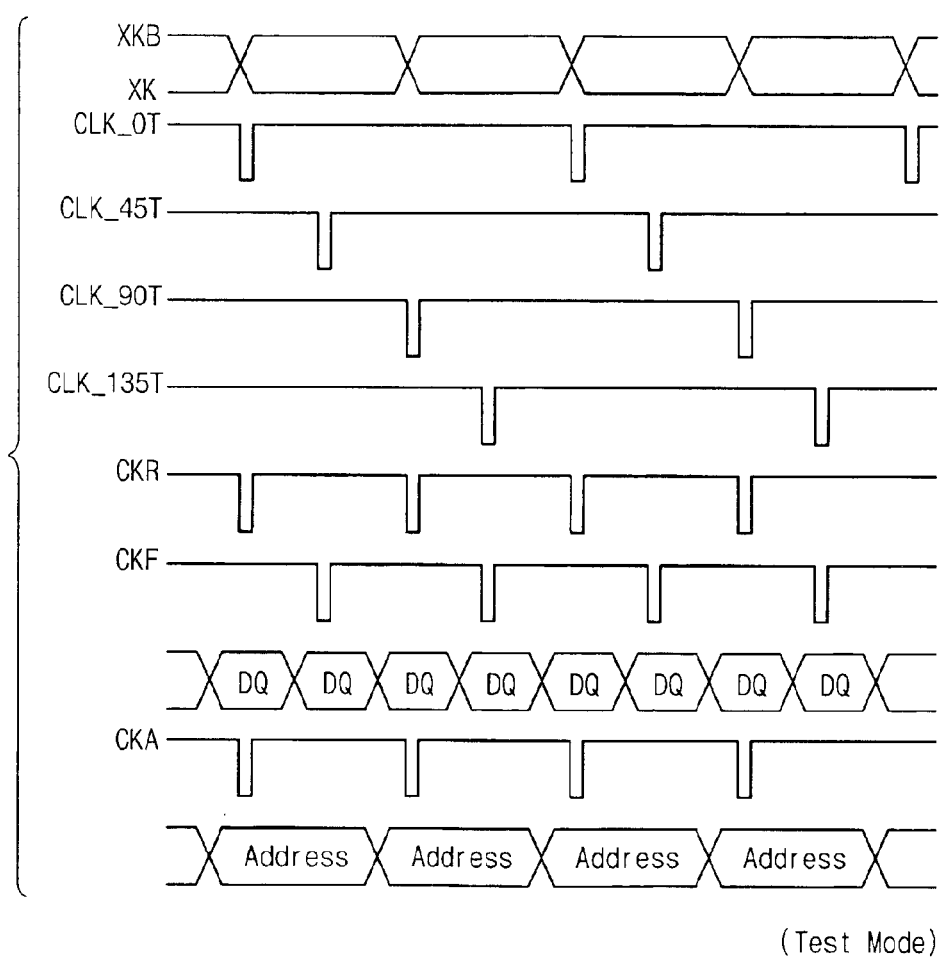
FIG. 13 is a timing chart illustrating the clock signals CKR and CKF and the address clock signal CKA generated in the test mode of the semiconductor memory device according to an exemplary embodiment of the present invention.

FIG. 13 is a timing chart of the data clock signals CKR and CKF and the address clock signal CKA generated in the test mode of the semiconductor memory device 100 according to an exemplary embodiment of the present invention.

In order to perform the read operation in the test mode, the control circuit 190 generates the control code C[i] of "1101". The second multiplexer 1190 of the SMDR circuit (of FIG. 4A) outputs the output signals OUT1, OUT2 and OUT3, which respectively have a 0T phase, a T/4 phase and a 0T phase, in response to the control code C[i]. The fourth multiplexer 1390 of the SMDF circuit (of FIG. 4B) outputs the output signals OUT1, OUT2 and OUT3, which respectively have a 3T/4 phase, a T/2 phase and a T/2 phase, in response to the control code C[i]. Accordingly, the third clock generator 1500 generates the address clock signal CKA synchronized at a 0T phase and a T/2 phase of the external clock signal XK. The address input circuit 120 receives the addresses in synchronization with the address clock signal CKA. In other words, in the read operation of the test mode, the addresses are input twice in synchronization with the low-high transition and the high-low transition of the external clock signal XK.

At the same time, the first clock generator 1250 generates the data clock signal CKR synchronized at a 0T and a T/2 phase of the external clock signal XK, and the second clock generator 1410 generates the data clock signal CKF synchronized at a T/4 and a 3T/4 phase of the external clock signal XK. The data output circuit 170 outputs the read-out data in synchronization with the data clock signals CKR and CKF. In other words, in the read operation of the test mode, the data is output four times in synchronization with the 0T, T/4, T/2 and 3T/4 phases of the external clock signal XK.

In accordance with the present invention, because the addresses are input in synchronization with the low-high transition and the high-low transition of the external clock signal XK in the test mode, it is possible to perform the read operation twice within one period of the external clock signal XK. Thus, when the operating frequency range of semiconductor test equipment is lower than that of a semiconductor memory device, it is possible to test the semiconductor memory device in its actual operating environment (e.g., a higher frequency range than that of the test equipment) by generating the address and data clock signals CKA, CKR and CKF at twice their speed.

Although exemplary embodiments of the present invention have been disclosed for illustrative purposes, those skilled in the art will appreciate that various modifications, additions and substitutions are possible, without departing from the scope and spirit of the invention as described in the accompanying claims and their equivalents.

What is claimed is:

1. A semiconductor memory device comprising:
   an array of memory cells;
   an address input circuit for receiving an external address in response to an address clock signal;
   a selecting circuit for selecting a memory cell in response to an address output from the address input circuit;
   a data output circuit for outputting data read out from the selected memory cell in response to first and second data clock signals; and
   an internal clock generating circuit for generating the address clock signal and the first and second data clock signals in response to an external clock signal and complementary clock signal, wherein the address clock signal and the first and second data clock signals have twice the frequency of the external clock signal in a test mode.

2. The semiconductor memory device of claim 1, wherein the internal clock generating circuit generates the address clock signal and the first and second data clock signals having the same frequency as the external clock signal in a normal mode.

3. The semiconductor memory device of claim 1, further comprising:
- a data input circuit for receiving external data in response to the first and second data clock signals;
- a write driver circuit for writing data from the data input circuit to the selected memory cell of the array of memory cells; and
- a read out circuit for reading out data from the selected memory cell and sending it to the data output circuit.

4. The semiconductor memory device of claim 1, wherein the internal clock generating circuit comprises a synchronous mirror delay circuit.

5. The semiconductor memory device of claim 1, wherein the semiconductor memory device is a double data rate (DDR) memory device.

6. The semiconductor memory device of claim 1, wherein, in the test mode, the internal clock generating circuit generates the address clock signal at every ¼ period of the external clock signal, the first data clock signal at every 0 and ½ periods of the external clock signal, and the second data clock signal at every ¼ and ¾ periods of the external clock signal.

7. The semiconductor memory device of claim 1, wherein, in a normal mode, the internal clock generating circuit generates the address clock signal at every 0 period of the external clock signal, the first data clock signal at every 0 period of the external clock signal, and the second data clock signal at every ½ period of the external clock signal.

8. A semiconductor memory device comprising:
- an array of memory cells;
- an address input circuit for receiving an external address in response to an address clock signal;
- a selecting circuit for selecting a memory cell in response to an address output from the address input circuit;
- a data output circuit for outputting data read out from the selected memory cell in response to first and second data clock signals;
- a first clock generating circuit comprising a first synchronous mirror delay circuit, for generating a first internal clock signal and a second internal clock signal having 0T and T/4 phases of an external clock signal, respectively, where T is a period of the external clock signal; and
- a second clock generating circuit comprising a second synchronous mirror delay circuit, for generating a third internal clock signal and a fourth internal clock signal having a T/2 and 3T/4 phases of the external clock signal, respectively;
- wherein, in a test mode, the address clock signal is generated in synchronization with the first, second, third and fourth internal clock signals, the first data clock signal is generated in synchronization with the first, second and third internal clock signals, and the second data clock signal is generated in synchronization with the second and fourth internal clock signals.

9. The semiconductor memory device of claim 8, further comprising:
- a first decoding circuit for decoding the first and second internal clock signals in response to control signals and outputting first, second and third decoding signals;
- a second decoding circuit for decoding the first and second internal clock signals in response to the control signals and outputting fourth, fifth and sixth decoding signals; and
- a third clock generating circuit for generating the first and second data clock signals and the address clock signal in response to the first, second, third, fourth, fifth and sixth decoding signals.

10. The semiconductor memory device of claim 8, wherein, in a normal mode, the address clock signal is generated in synchronization with the first internal clock signal, the first data clock signal is generated in synchronization with one of the first and second internal clock signals, and the second data clock signal is generated in synchronization with one of the third and fourth internal clock signals.

11. The semiconductor memory device of claim 8, further comprising:
- a data input circuit for receiving external data in response to the first and second data clock signals;
- a write driver circuit for writing data from the data input circuit to the selected memory cell of the array of memory cells; and
- a read out circuit for reading out data from the selected memory cell and sending it to the data output circuit.

12. The semiconductor memory device of claim 8, wherein the semiconductor memory device is a double data rate (DDR) memory device.

13. The semiconductor memory device of claim 8, wherein the first synchronous mirror delay circuit comprises:
- a first clock buffer for generating a first reference clock signal in response to the external clock signal;
- a first delay monitor circuit for delaying the first reference clock signal;
- a first forward delay array for sequentially delaying an output clock signal of the first delay monitor circuit in a forward direction to generate first delay clock signals;
- a first mirror control circuit for receiving the first delay clock signals and the first reference clock signal and detecting one of the first delay clock signals synchronized with the first reference clock signal;
- a first backward delay array for delaying the detected delay clock signal in a backward direction to output the first internal clock signal;
- a first unit delay element for delaying the first internal clock signal by a delay time of T/8;
- a second forward delay array for sequentially delaying the first internal clock signal in a forward direction to generate second delay clock signals;
- a second mirror control circuit for detecting one of the second delay clock signals synchronized with the output clock signal of the first unit delay element; and
- a second backward delay array for delaying the detected delay clock signal in a backward direction to output the second internal clock signal.

14. The semiconductor memory device of claim 8, wherein the second synchronous mirror delay circuit comprises:
- a second clock buffer for generating a second reference clock signal in response to an external clock signal;
- a second delay monitor circuit for delaying the second reference clock signal;
- a third forward delay array for sequentially delaying an output clock signal of the second delay monitor circuit in a forward direction to generate third delay clock signals;
- a third mirror control circuit for receiving the third delay clock signals and the second reference clock signal and detecting one of the third delay clock signals synchronized with the second reference clock signal;

a third backward delay array for delaying the detected delay clock signal in a backward direction to output the third internal clock signal;

a second unit delay element for delaying the second internal clock signal by a delay time of T/8;

a fourth forward delay array for sequentially delaying the third internal clock signal in a forward direction to generate fourth delay clock signals;

a fourth mirror control circuit for detecting one of the fourth delay clock signals synchronized with the output clock signal of the second unit delay element; and a fourth backward delay array for delaying the detected delay clock signal in a backward direction to output the fourth internal clock signal.

15. A semiconductor memory device, comprising:

a memory cell array for storing data, wherein the memory cell array comprises a plurality of memory cells;

an address input circuit for receiving external address signals in synchronization with an address clock signal output from an internal clock generating circuit;

a decoder for decoding addresses output from the address input circuit and selecting a memory cell that is associated with the addresses output from the address input circuit of the memory cell array;

a data input circuit for receiving a first and second data clock signal from an internal clock generating circuit;

a data output circuit for outputting data from the selected memory cells and an internal clock generating circuit for receiving external clock signals and generating the address clock signal and the first and second data clock signals, wherein the address clock signal and first and second data clock signals have twice the frequency of the external clock signals according to a mode of operation.

16. The semiconductor memory device of claim 15, further comprising:

a write driver circuit for writing data received from the data input circuit to the selected memory cell from the array of memory cells; and a read-out circuit for reading out data from the selected memory cell from the array of memory cells.

17. The semiconductor memory device of claim 15, wherein the internal clock generating circuit generates the address clock signal and the first and second data clock signals having the same frequency as the external clock signal in a normal mode.

18. The semiconductor memory device of claim 15, wherein, in the test mode, the internal clock generating circuit generates the address clock signal at a ¼ period of the external clock signal, the first data clock signal at a 0 and ½ periods of the external clock signal, and the second data clock signal at a ¼ and ¾ periods of the external clock signal.

19. The semiconductor memory device of claim 15, wherein, in a normal mode, the internal clock generating circuit generates the address clock signal at a 0 period of the external clock signal, the first data clock signal at a 0 period of the external clock signal, and the second data clock signal at a ½ period of the external clock signal.

* * * * *